(12) United States Patent
Shigihara (10) Patent No.: US 6,849,956 B2
(45) Date of Patent: Feb. 1, 2005

(54) SEMICONDUCTOR INTEGRATED CIRCUIT WITH SHORTENED PAD PITCH (75) Inventor: Takeo Shigihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/430,341

(22) Filed: May 7, 2003

(65) Prior Publication Data
US 2003/0214008 A1 Nov. 20, 2003

(30) Foreign Application Priority Data
May 15, 2002 (JP) ........................................ 2002-140078

(51) Int. Cl.[7] .............................................. H01L 23/48
(52) U.S. Cl. ........................ 257/786; 257/691; 257/48
(58) Field of Search ................................ 257/786, 691, 257/48

(56) References Cited
U.S. PATENT DOCUMENTS 5,266,826 A * 11/1993 Umeyama ................... 257/368
5,521,530 A * 5/1996 Yao et al. ...................... 326/80
5,543,651 A * 8/1996 Sato ............................ 257/369
5,825,083 A * 10/1998 Takata et al. ................ 257/691
5,949,106 A * 9/1999 Kai et al. .................... 257/341
6,531,785 B2 * 3/2003 Shimizu et al. ............. 257/786

FOREIGN PATENT DOCUMENTS

JP          63-199439       8/1988
JP          5-166902        7/1993

* cited by examiner

Primary Examiner—Jasmine Clark
(74) Attorney, Agent, or Firm—Westerman, Hattori, Daniels & Adrian, LLP (57) ABSTRACT An semiconductor integrated circuit includes a plurality of first pads having first size, a plurality of second pads having second size smaller than the first size, a switch circuit which couples the first pads to respective first core circuits in a first switching state, and couples the first pads to respective second core circuits in a second switching state, the second core circuits being connected to the second pads, wherein the first pads and the second pads are mixed and arranged in line.

10 Claims, 7 Drawing Sheets

SEMICONDUCTOR INTEGRATED CIRCUIT WITH SHORTENED PAD PITCH

CROSS-REFERENCE TO RELATED APPLICATIONS

The present application is based upon and claims the benefit of priority from the prior Japanese Patent Application No. 2002-140078 filed on May 15, 2002, with the Japanese Patent Office, the entire contents of which are incorporated herein by reference.

BACKGROUND OF THE INVENTION

1. Field of the Invention

The present invention generally relates to semiconductor integrated circuits, and particularly relates to a semiconductor integrated circuit having pads thereof arranged in line.

2. Description of the Related Art

LSIs (larges-scale semiconductor integrated circuits) are provided with pads for the purpose of inputting/outputting signals from/to the exterior. As a single LSI chip is required to have an increased number of functions, the number of pads also increases due to an increase in the number of signal inputs/outputs. As the chip size decreases in response to improved circuit density, the size and pitch of pads need to be decreased in accordance with the reduction of chip size.

In particular, a numerous number of signal inputs/outputs are provided in a driver IC or the like that drives a liquid crystal display panel, resulting in a large number of pads being arranged at short intervals on a single LSI chip. These pads are generally arranged in line (such as to form a straight line).

Figure 1:
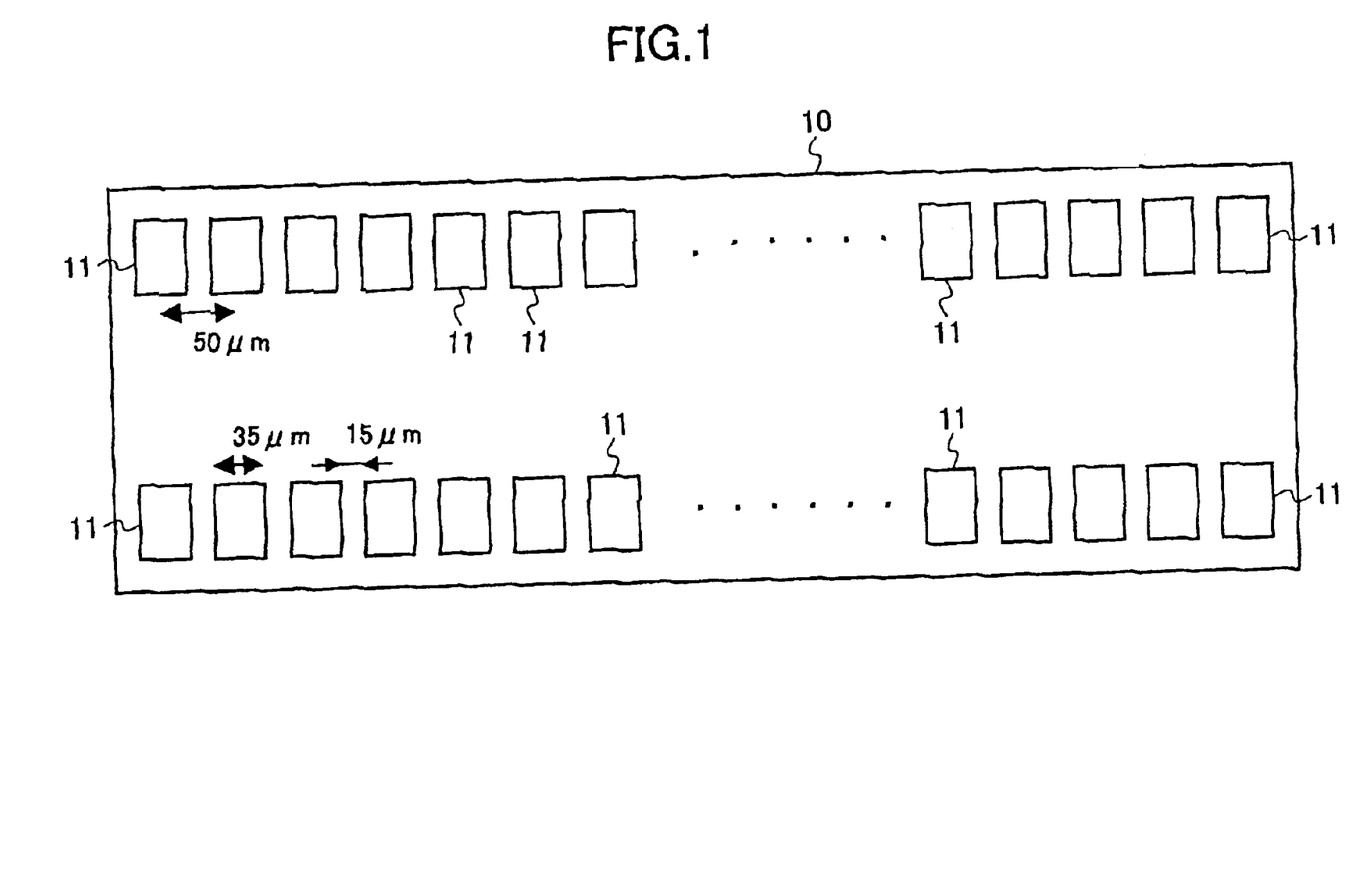
FIG. 1 is an illustrative drawing showing a pad arrangement on an LSI such as s driver IC for driving a liquid crystal display panel.

FIG. 1 is an illustrative drawing showing a pad arrangement on an LSI such as a driver IC for driving a liquid crystal display panel.

Figure 2:
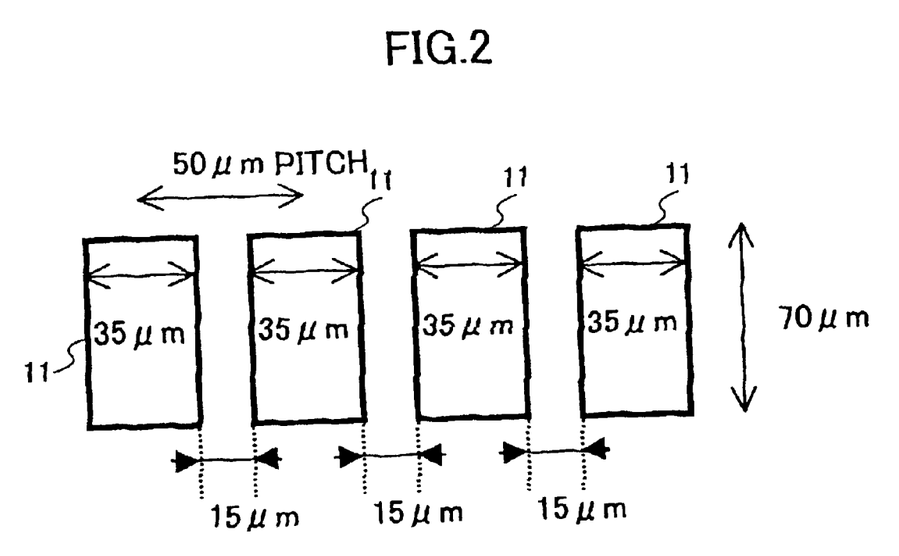
FIG. 2 is an illustrative drawing showing an example of the size and layout of the pads shown in FIG. 1.

On an LSI chip 10 shown in FIG. 1, a plurality of pads 11 are arranged in line so as to form two rows. FIG. 2 is an illustrative drawing showing an example of the size and layout of the pads 11.

As shown in FIG. 2, the pads 11 have a rectangular shape measuring 70 micrometers by 35 micrometers, and are arranged at 15-micrometer intervals. The pitch is 50 micrometers when it is defined as a distance between the centers of adjacent pads.

LSIs manufactured in factory undergo tests for checking operations prior to shipment. In such tests, probe needles are brought into contact with more than one pad to detect input/output signals corresponding to required test signals. Based on the output signals, a check is made as to whether the operations of LSIs are proper.

A probe needle has a diameter of approximately 15 micrometers, and positioning typically involves an error in the range of at least 5 micrometers. When a probe needle comes in contact with a pad, secure contact is necessary. Otherwise, improper contact will results in a failure of the test. Because of this, as shown in FIG. 2, the pad size of about 35 micrometers and the pad pitch of about 50 micrometers are close to the limits that ensure secure contact and avoid wrong contact with an adjacent pad. Probe needles may be made thinner so as to be usable for narrower pitch. This is not desirable, however, because of problems associated with the durability of needles.

Accordingly, there is a need for a semiconductor integrated circuit which has pads arranged at intervals narrower than necessary for proper measurement by a probe needle, but is provided with a mechanism that allows a probe needle to make secure contact with a pad.

SUMMARY OF THE INVENTION

It is a general object of the present invention to provide a semiconductor integrated circuit that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor integrated circuit particularly pointed out in the specification in such full, clear, concise, and exact terms as to enable a person having ordinary skill in the art to practice the invention.

To achieve these and other advantages in accordance with the purpose of the invention, the invention provides an semiconductor integrated circuit, including a plurality of first pads having first size, a plurality of second pads having second size smaller than the first size, a switch circuit which couples the first pads to respective first core circuits in a first switching state, and couples the first pads to respective second core circuits in a second switching state, the second core circuits being connected to the second pads, wherein the first pads and the second pads are mixed and arranged in line.

In the semiconductor integrated circuit described above, two types of pads are mixed and arranged in line, one type being the first pads for probe contact having a width that enables a probe needle to secure proper contact, and the other type being the second pads having a narrower width. This makes it possible to increase pad density by shortening a pad pitch compared to when all the pads arranged in line have the same width as the pads for probe contact. Further, the switch circuit is provided such that input/output signals corresponding to the second pads having narrower width are input/output through the first pads for probe contact. During test operations, the probe needles are brought into contact with the pads for probe contact, and the switching state of the switch circuit is controlled so that all the signals corresponding to the narrower pads as well as the pads for probe contact are input/output through the pads for probe contact. In this manner, the pitch of pads on the semiconductor integrated circuit is shortened to increase the bandwidth of signal input/output while maintaining secure contact between the probe needles and the pads.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 3:
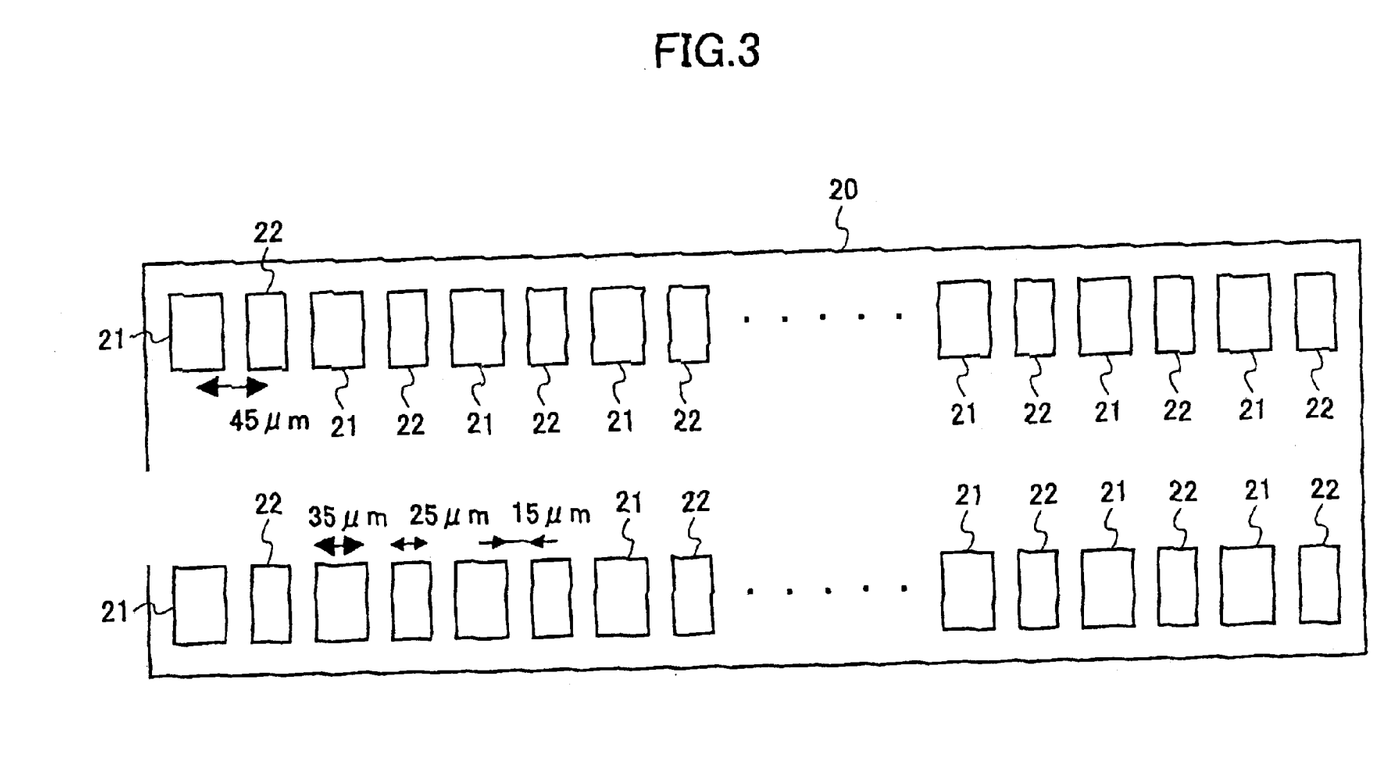
FIG. 3 is an illustrative drawing showing a pad arrangement on a semiconductor integrated circuit according to the present invention.
Figure 4:
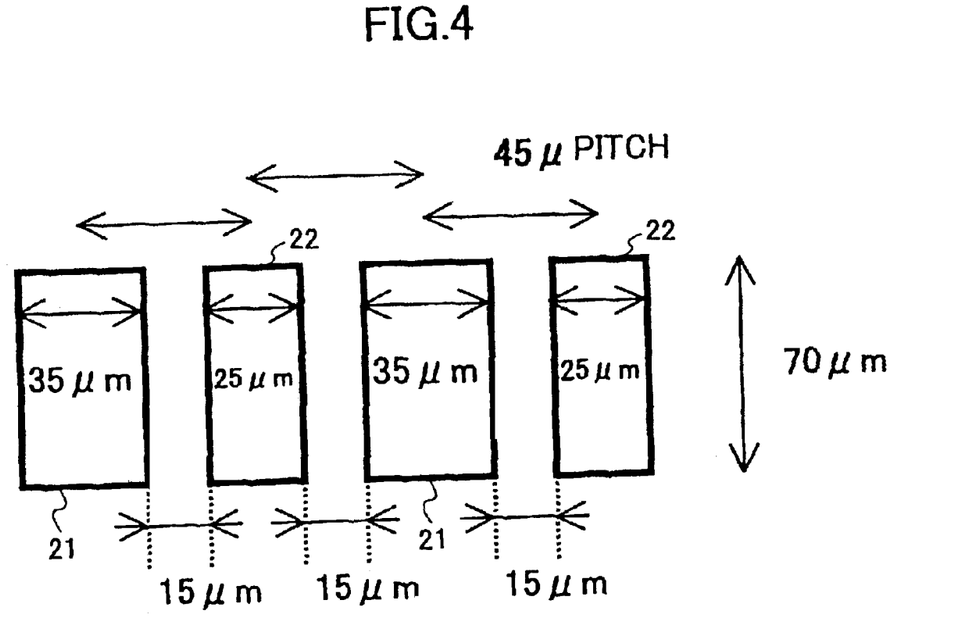
FIG. 4 is an example of the size and layout of the first pads and the second pads shown in FIG. 3.

FIG. 3 is an illustrative drawing showing a pad arrangement on a semiconductor integrated circuit according to the present invention. A semiconductor integrated circuit 20 of FIG. 3 is a driver IC or the like that drives a liquid crystal display panel, for example. A plurality of first pads 21 and a plurality of second pads 22 are arranged in turn to form a line, and two rows are provided in such a manner. FIG. 4 is an example of the size and layout of the first pads 21 and the second pads 22.

As shown in FIG. 4, each of the first pads 21 has a rectangular shape measuring 70 micrometers by 35 micrometers. The second pads 22 are smaller than the first pads 21, and each has a rectangular shape measuring 70 micrometers by 25 micrometers. The first pads 21 and the second pads 22 are situated in turn such that the first pads 21 come next to the second pads 22. Intervals between adjacent pads are 15 micrometers. The pitch is 45 micrometers when it is defined as a distance between the center of a pad 21 and the center of a pad 22.

In the semiconductor integrated circuit 20 of the present invention, pads having such a size (e.g., a width of 35 micrometers) as to ensure secure contact with a probe needle and smaller pads (e.g., a width of 25 micrometers) are arranged in turn in line. In this case, it is difficult to secure proper contact with respect to the smaller pads measuring 25 micrometers in width. With a short pitch of 45 micrometers between pads, it is also difficult to prevent a probe needle from coming in contact with a wrong pad at an adjacent position. Accordingly, one-to-one contact between needles and pads would be extremely hard to make.

In the present invention, the first pads 21 (35 micrometer in width) are provided as objects to be touched-by a probe, and the second pads 22 (25 micrometers in width) are not used to test the semiconductor integrated circuit. It is necessary, however, to detect signals output from the second pads 22 during tests. In consideration of this, a signal switching mechanism is provided in the LSI to supply the signals of the second pads 22 to the first pads 21.

Figure 5:
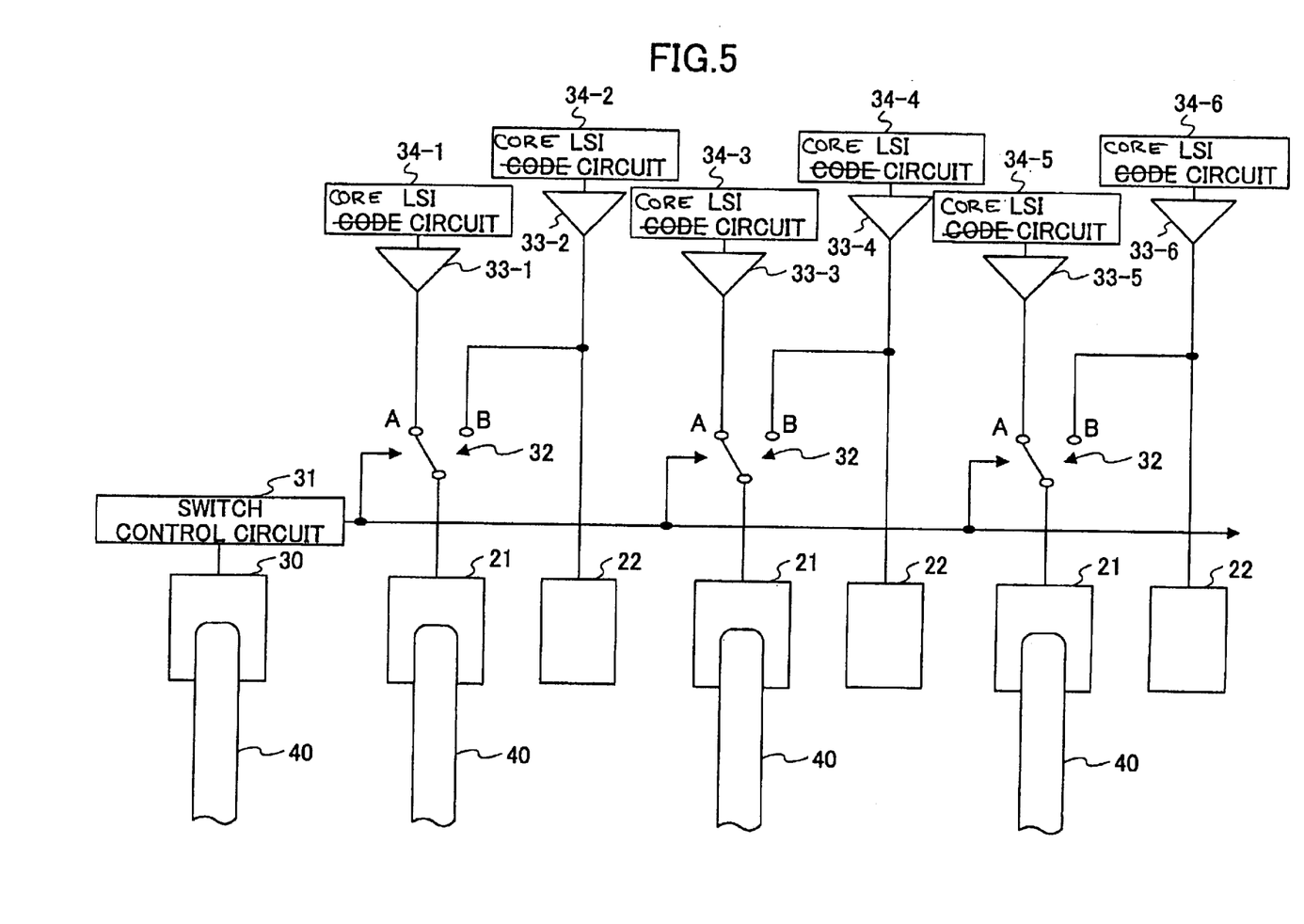
FIG. 5 is a circuit diagram showing a signal switching mechanism provided in the semiconductor integrated circuit according to the present invention.

FIG. 5 is a circuit diagram showing the signal switching mechanism provided in the semiconductor integrated circuit according to the present invention.

As shown in FIG. 5, the semiconductor integrated circuit 20 of the present invention includes the first pads 21, the second pads 22, a switch-signal pad 30, a switch control circuit 31, a plurality of switch circuits 32 serving as the signal switching mechanism, a plurality of output buffers 33-1 through 33-6, and various core circuits 34-1 through 34-6. Signals provided from the core circuits 34-1 through 34-6 are supplied as output signals to the first pads 21 or the second pads 22 through the output buffers 33-1 through 33-6. Although FIG. 5 shows only a circuit portion corresponding to six output pads, more than six pads are typically provided as shown in FIG. 3 where each of such output pads is provided with the same mechanism as shown in FIG. 5.

One of the first pads 21 is paired to a corresponding one of the second pads 22. A switch circuit 32 is provided for each pair. The switch circuits 32 are controlled as to its switching state by the switch control circuit 31, so that the first pads 21 are coupled to the A nodes in a first switching state, and are coupled to the B nodes in a second switching state. In the first switching state, therefore, signals output from the core circuits 34-1, 34-3, and 34-5 are supplied to the first pads 21, and signals output from the core circuits 34-2, 34-4, and 34-6 are provided to the second pads 22. In the second switching state, signals output from the core circuits 34-2, 34-4, and 34-6 are supplied to both the first pads 21 and the second pads 22.

The first switching state is used at the time of routine and normal operations of the semiconductor integrated circuit 20, so that output signals of the core circuits are output to the exterior from respective pads by maintaining one-to-one correspondence.

At the time of test operations of the semiconductor integrated circuit 20, a plurality of probe needles 40 are brought into contact with the first pads 21 at the same time as shown in FIG. 5. One of the probe needles 40 comes in contact with the switch-signal pad 30. A potential level applied to the switch-signal pad 30 is changed to control the operation of the switch control circuit 31, for example. The switch control circuit 31 sets the switching state of the switch circuits 32 to either the first switching state or the second switching state.

During the test operations of the semiconductor integrated circuit 20, the first switching state is used to supply the output signals of the core circuits 34-1, 34-3, and 34-5 to the first pads 21, with the probe needles 40 detecting the output signals. Further, the second switching state is used to supply the output signals of the core circuits 34-2, 34-4, and 34-6 to the first pads 21, with the probe needles 40 detecting the output signals.

With the probe needles 40 being kept in contact with the first pads 21 during the test operations, therefore, not only the signals corresponding to the first pads 21 are detected, but also the signals belonging to the second pads 22 are detected. In FIG. 5, both the first pads 21 and the second pads 22 convey output signals from the core circuits to the exterior. Alternatively, either one or both of a pad 21 and a pad 22 paired together may be configured to convey a signal input from the exterior into the core circuits. Needless to say, signal switching by the switch control circuit 31 and the switch circuits 32 can be made in the same manner as described above. In this case, the circuit portion that receives signal input from the exterior is provided with input buffers in place of the output buffers shown in FIG. 5.

Figure 6:
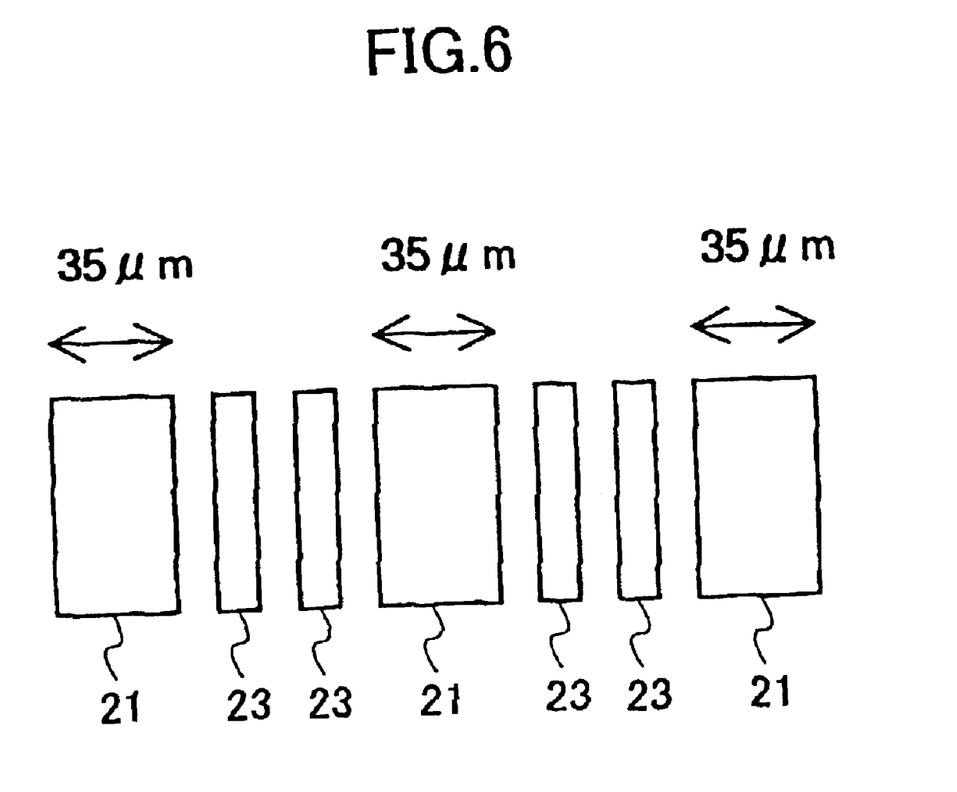
FIG. 6 is an illustrative drawing showing a variation of a pad arrangement on the semiconductor integrated circuit according to the present invention.

FIG. 6 is an illustrative drawing showing a variation of a pad arrangement on the semiconductor integrated circuit according to the present invention.

Figure 7:
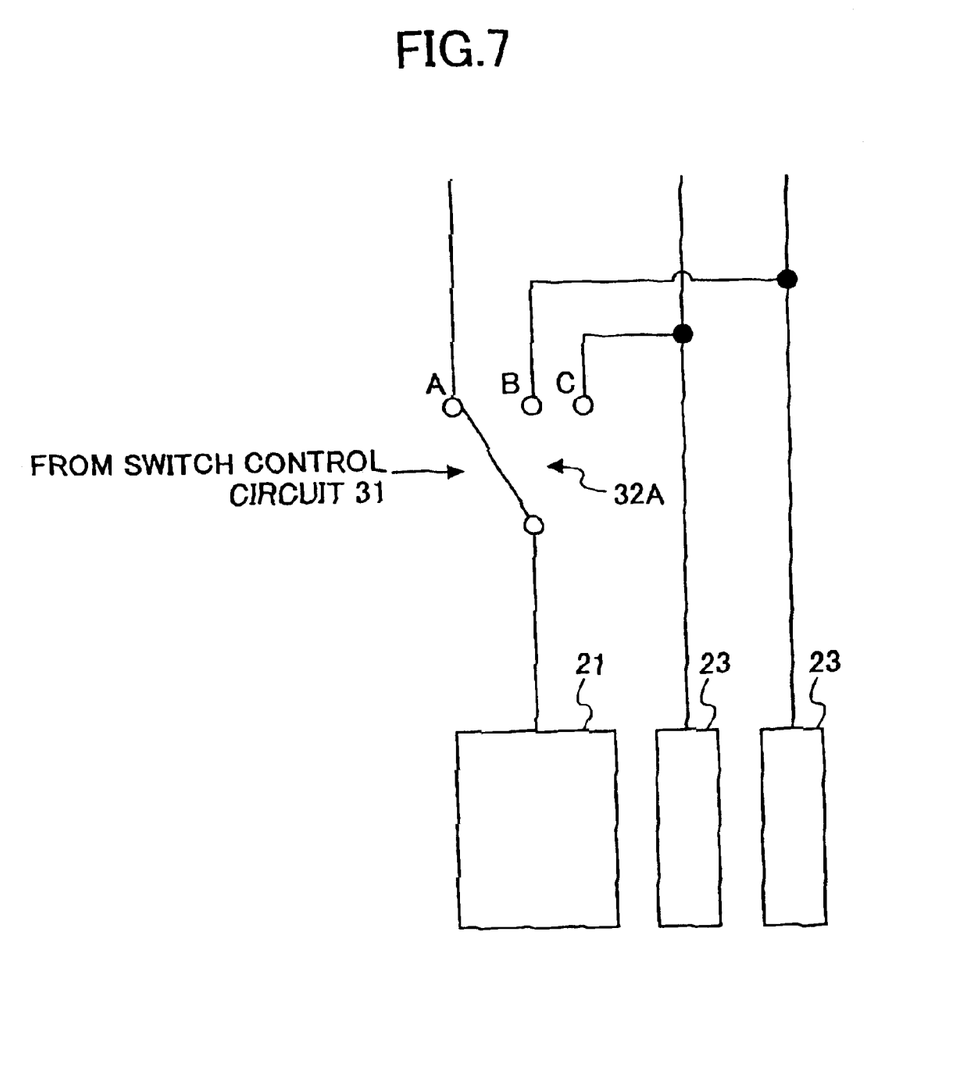
FIG. 7 is a circuit diagram showing another example of the signal switching mechanism provided in the semiconductor integrated circuit according to the present invention.

A pad arrangement according to the present invention is not limited to two types of pads having different sizes that are arranged in turn. As shown in FIG. 6, for example, two types of pads 21 and 23 having different sizes may be arranged in line such that two or more narrower pads 23 (two in FIG. 6) are inserted between the pads 21, which have such a size (e.g., 35 micrometers in width) as to allow a probe needle to achieve secure contact. The pads 23 may be the same size as the second pads 22 shown in FIG. 4, or may be narrower. If two pads 23 are provided for each of the pads 21, a switch circuit 32A may be used that selectively connects a switch to one of the three nodes as shown in FIG. 7. The switch circuit 32A operates in one of the first through third switching states that correspond to the respective couplings of the pad 21 to a node A through a node C.

In FIG. 6, an identical number of the pads 23 are inserted between any two adjacent pads 21. However, the number of the pads 23 inserted between the adjacent pads 21 may differ from one place to another. Further, the size (width) of the pads 23 may not need to be constant.

In this manner, the present invention mixes two types of pads and arranges them in line, one type being a pad for probe contact having a width (e.g., 35 micrometers) enabling a probe needle to secure proper contact, and the other type being a pad having a narrower width. This makes it possible to increase pad density by reducing a pad pitch compared to when all the pads arranged in line have the same width as the pads for probe contact. Further, a switch circuit is provided such that input/output signals corresponding to the narrower pads are input/output through the pads for probe contact. During test operations, the probe needles are brought into contact with the pads for probe contact, and the switching state of the switch circuit is controlled so that the signals corresponding to all the pads including the pads for probe contact and the narrower pads are input/output through the pads for probe contact. In this manner, the pitch of pads on the semiconductor integrated circuit is shortened to increase the bandwidth of signal input/output while maintaining secure contact between the probe needles and the pads.

Further, the present invention is not limited to these embodiments, but various variations and modifications may be made without departing from the scope of the present invention.

What is claimed is:

1. An semiconductor integrated circuit, comprising:
   a plurality of first pads having first size;
   a plurality of second pads having second size smaller than the first size;
   a switch circuit which couples said first pads to respective first core circuits in a first switching state, and couples said first pads to respective second core circuits in a second switching state, said second core circuits being connected to said second pads, wherein said first pads and said second pads are mixed and arranged in line.

2. The semiconductor integrated circuit, as claimed in claim 1, further comprising:
   a plurality of third pads having third size smaller than the first size, said third pads being mixed and arranged in line with said first pads and said second pads, wherein said switch circuit couples said first pads to respective third core circuits in a third switching state, said third core circuits being connected to said third pads.

3. The semiconductor integrated circuit as claimed in claim 1, wherein said first pads and said second pads are arranged in turn.

4. The semiconductor integrated circuit as claimed in claim 1, wherein said first pads have such a size that probe needles for test purposes maintain secure contact with said first pads.

5. The semiconductor integrated circuit as claimed in claim 4, wherein said first pads have a width of at least 35 micrometers.

6. The semiconductor integrated circuit as claimed in claim 4, wherein said second pads are smaller than necessary for the probe needles to maintain secure contact with said second pads.

7. The semiconductor integrated circuit as claimed in claim 1, further comprising:
   a third pad;
   a switch control circuit which controls the switching state of said switch circuit in response to a signal input into said third pad.

8. A semiconductor integrated circuit, comprising:
   a plurality of first pads;
   a plurality of second pads smaller than said first pads;
   a switch circuit which &e is controlled to couple said second pads to said first pads, wherein said first pads and said second pads are mixed and arranged in line.

9. The semiconductor integrated circuit as claimed in claim 8, wherein said switch circuit couples said second pads to said first pads during test operation.

10. The semiconductor integrated circuit as claimed in claim 8, wherein said first pads have size that is no more than necessary for probe needles for test purposes to maintain secure contact with said first pads.

* * * * *